US 6,528,833 B2

(12) United States Patent
Lee et al.

(10) Patent No.: US 6,528,833 B2
(45) Date of Patent: Mar. 4, 2003

(54) CMOS ACTIVE PIXEL FOR IMPROVING SENSITIVITY

(75) Inventors: Seo Kyu Lee, Cheongju (KR); Dae Sung Min, Daejeon Metropolitan (KR)

(73) Assignee: Pixelplus Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/883,493

(22) Filed: Jun. 19, 2001

(65) Prior Publication Data

US 2002/0020863 A1 Feb. 21, 2002

(51) Int. Cl.[7] ............................................. H01L 31/062
(52) U.S. Cl. ........................ 257/292; 257/233; 257/290; 257/291; 257/369
(58) Field of Search ................................. 257/292, 291, 257/233, 290, 369

(56) References Cited

U.S. PATENT DOCUMENTS

| | | | | |
|---|---|---|---|---|
| 5,625,210 A | * | 4/1997 | Lee et al. ..................... | 257/292 |
| 5,880,495 A | * | 3/1999 | Chen ............................ | 257/233 |
| 5,955,753 A | * | 9/1999 | Takahashi .................... | 357/292 |
| 6,218,691 B1 | * | 7/2001 | Chung et al. ................ | 257/290 |
| 6,339,248 B1 | * | 1/2002 | Zhao et al. .................. | 257/461 |
| 6,388,243 B1 | * | 5/2002 | Berezin et al. ........... | 250/208.1 |
| 2002/0017661 A1 | * | 2/2002 | Shinohara .................... | 257/238 |

FOREIGN PATENT DOCUMENTS

| | | | |
|---|---|---|---|
| EP | 942 593 | * | 9/1999 |
| JP | 10070261 | * | 3/1998 |

* cited by examiner

*Primary Examiner*—Nathan J. Flynn
*Assistant Examiner*—Ahmed N. Sefer
(74) *Attorney, Agent, or Firm*—Rabin & Berdo, P.C.

(57) ABSTRACT

A CMOS active pixel of increased sensitivity includes a floating diffusion layer, a photo-diode, a reset circuit and an output circuit The floating diffusion layer is of a first dopant type and receives a signal charge. The photo-diode generates the signal charge depending on an energy inputted thereto and transfers the signal charge to the floating diffusion layer. The photo-diode has first and second lower diode dopant layers of the first dopant type and an upper diode dopant layer of a second dopant type. The polarity of the second dopant type is opposite to that of the first dopant type. The first and second lower diode dopant layers are formed to contact a lower portion of the upper diode dopant layer. The upper diode dopant layer and the first lower diode dopant layer are formed to contact the floating diffusion layer. The second lower diode dopant layer is formed to contact the first lower diode dopant layer. The reset circuit controls a voltage level of the floating diffusion layer to a reset voltage level in response to a control signal. A doping concentration of the first lower diode dopant layer is less than that of the floating diffusion layer. A doping concentration of the second lower diode dopant layer is less than that of the first lower diode dopant layer.

7 Claims, 12 Drawing Sheets

CM OS ACTIVE PIXEL FOR IMPROVING SENSITIVITY

BACKGROUND OF THE INVENTION

1. Field of the Invention

The invention relates to an image sensor, and more particularly, to a pixel structure of a complementary metal oxide semiconductor (CMOS) image sensor.

2. Description of the Related Art

Generally, an image sensor captures images by using a doped semiconductor element having a characteristic that responds to some kind of an external electromagnetic energy (for example, light). Light emitted from each object in the natural world has a characteristic energy value such as a wavelength, etc. A pixel of the image sensor senses the light emitted from the object and converts a light energy value to an electrical energy value. That is, the pixel of the image sensor generates the electrical value in response to the light energy, etc., that is emitted from the object.

Figure 1:
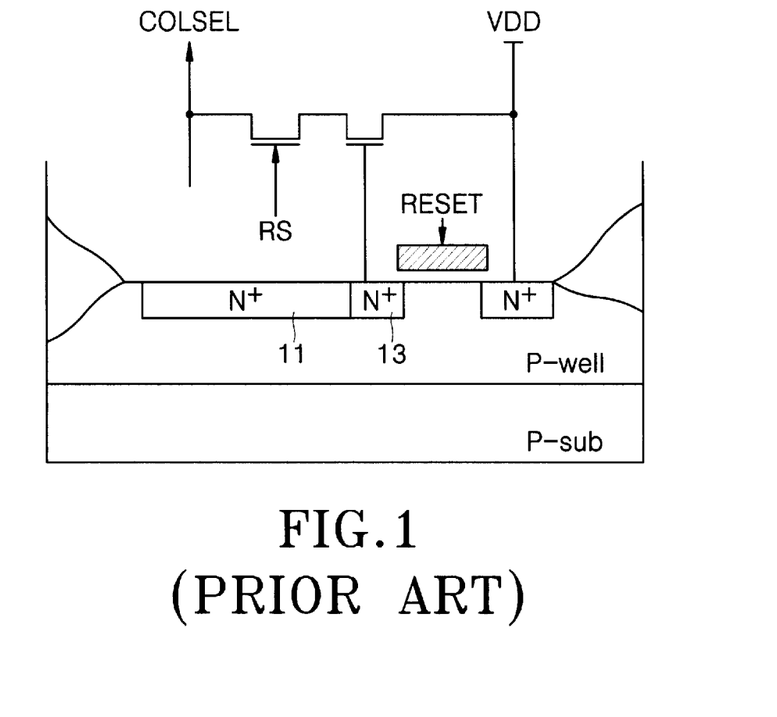
FIG. 1 represents a conventional 3-transistor CMOS active pixel.

FIG. 1 represents a cross section of a photo-diode according to a conventional 3-transistor CMOS active pixel, with related circuitry. According to the conventional 3-transistor CMOS active pixel, an N$^+$-type dopant layer 11 forming a side junction of the photo-diode is in contact with an N$^+$-type floating diffusion layer 13. Therefore capacitance of the photo-diode is substantially equal to the sum of capacitances respectively provided by the N$^+$-type dopant layer 11 and the N$^+$-type floating diffusion layer 13. Thus, an image sensor using a conventional 3-transistor CMOS active pixel has poor sensitivity. To overcome this disadvantage of the 3-transistor CMOS active pixel, a 4-transistor CMOS active pixel has been developed.

Figure 2:
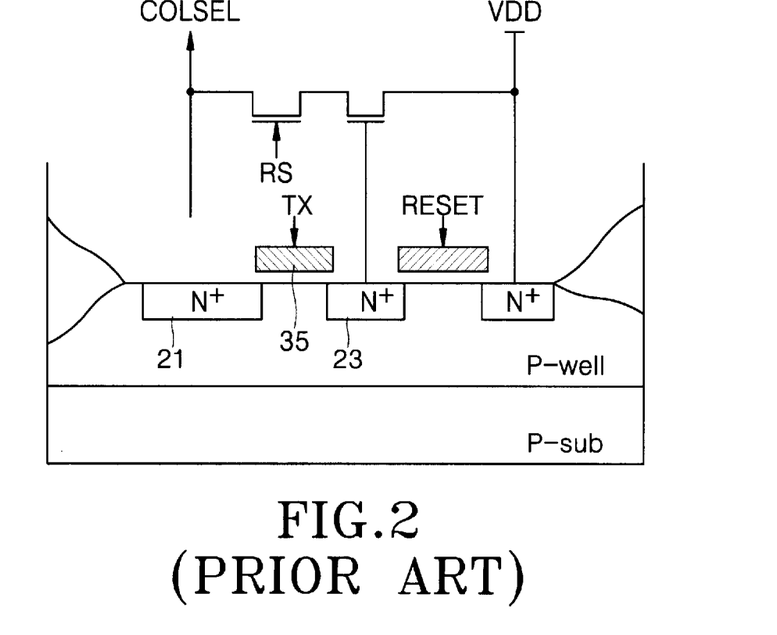
FIG. 2 illustrates a conventional 4-transistor CMOS active pixel.

FIG. 2 illustrates a cross section of a photo-diode according to a conventional 4-transistor CMOS active pixel, with related circuitry. In a conventional 4-transistor CMOS active pixel, a transfer transistor 35 is used to remove noise. The transfer transistor 35 is controlled by a transfer control signal TX. An N$^+$-type dopant layer 21, forming a side junction, is separated from an N$^+$-type floating diffusion layer 23. As a result, the conventional 4-transistor CMOS active pixel provides an image sensor with high sensitivity and high quality. However, the conventional 4-transistor CMOS active pixel has a reduced light receiving area due to the additional element, i.e., the transfer transistor 35.

In summary, both types of conventional CMOS active pixels have problems: The conventional 3-transistor CMOS active pixel has poor sensitivity. The conventional 4-transistor CMOS active pixel has a reduced light receiving area.

SUMMARY OF THE INVENTION

It is an object of the invention to solve the above-described problems. In particular, it is an object of the invention to provide a CMOS active pixel capable of high sensitivity while minimizing a reduction in light receiving area.

To achieve the above object, there is provided a CMOS active pixel formed on a semiconductor substrate. According to one aspect of the invention, the CMOS active pixel includes a floating diffusion layer, a photo-diode, a reset circuit and an output circuit. The floating diffusion layer is doped with a dopant of a first dopant type and receives a signal charge. The photo-diode generates the signal charge, and transfers the signal charge to the floating diffusion layer. The photo-diode has a lower diode dopant layer of the first dopant type, and an upper diode dopant layer of a second dopant type. The polarity of the dopant of the second dopant type is opposite to that of the first dopant type. The upper diode dopant layer is formed on the lower diode dopant layer. The reset circuit, in response to a control signal, controls the voltage of the floating diffusion layer to a reset voltage level. The output circuit generates an output signal corresponding to the voltage level of the floating diffusion layer. In this case, the electric potential energy of the lower diode dopant layer is higher than that of the floating diffusion layer, in an initial state of the pixel. Preferably, a doping concentration of the lower diode dopant layer is less than that of the floating diffusion layer.

According to another aspect of the invention, a CMOS active pixel formed on a semiconductor substrate includes a floating diffusion layer, a photo-diode, a reset circuit and an output circuit. The floating diffusion layer is doped with a dopant of a first dopant type and receives a signal charge. The photo-diode generates a signal charge and transfers the signal charge to the floating diffusion layer. The photo-diode has a first and a second lower diode dopant layer each of the first dopant type and an upper diode dopant layer of a second dopant type. The polarity of the dopant of the second dopant type is opposite to that of the first dopant type. The upper diode dopant layer is formed on the first and the second lower diode dopant layers. The first lower diode dopant layer is formed between the floating diffusion layer and the second lower dopant layer. The reset circuit controls a voltage of the floating diffusion layer to a reset voltage level in response to a control signal. The output circuit generates an output signal corresponding to the voltage level of the floating diffusion layer. In this case, an electric potential energy of the first lower diode dopant layer in an initial state of the pixel is higher than that of the floating diffusion layer. An electric potential energy of the second lower diode dopant layer in the initial state of the pixel is higher than that of the first lower diode dopant layer. Preferably, a doping concentration of the first lower diode dopant layer is less than that of the floating diffusion layer. Further, a doping concentration of the second lower diode dopant layer is less than that of the first lower diode dopant layer.

According to still another aspect of the invention, CMOS includes a floating diffusion layer, a photo-diode, a reset circuit and an output circuit. The floating diffusion layer is a first dopant type and receives a signal charge. The photo-diode generates the signal charge according to an energy inputted thereto, and transfers the signal charge to the floating diffusion layer. The photo-diode has a lower diode dopant layer of the first dopant type, an upper diode dopant layer of a second dopant type and a separating layer. The polarity of the upper diode dopant layer is opposite to that of the lower diode dopant layer. The upper diode dopant layer is formed on the lower diode dopant layer. The separating layer is formed between the lower diode dopant layer and the floating diffusion layer. The reset circuit controls a voltage of the floating diffusion layer to a reset voltage level in response to a control signal. The output circuit generates an output signal corresponding to the voltage level of the floating diffusion layer. In this case, the electric potential energy of the separating layer in an initial state of the pixel is higher than that of the floating diffusion layer.

BRIEF DESCRIPTION OF THE DRAWINGS

The foregoing and further objects, features and advantages of the invention will become more apparent from a consideration of the following description and the accompanying drawings, in which the same numerals indicate the same or corresponding parts.

DESCRIPTION OF THE PREFERRED EMBODIMENTS

Figure 3:
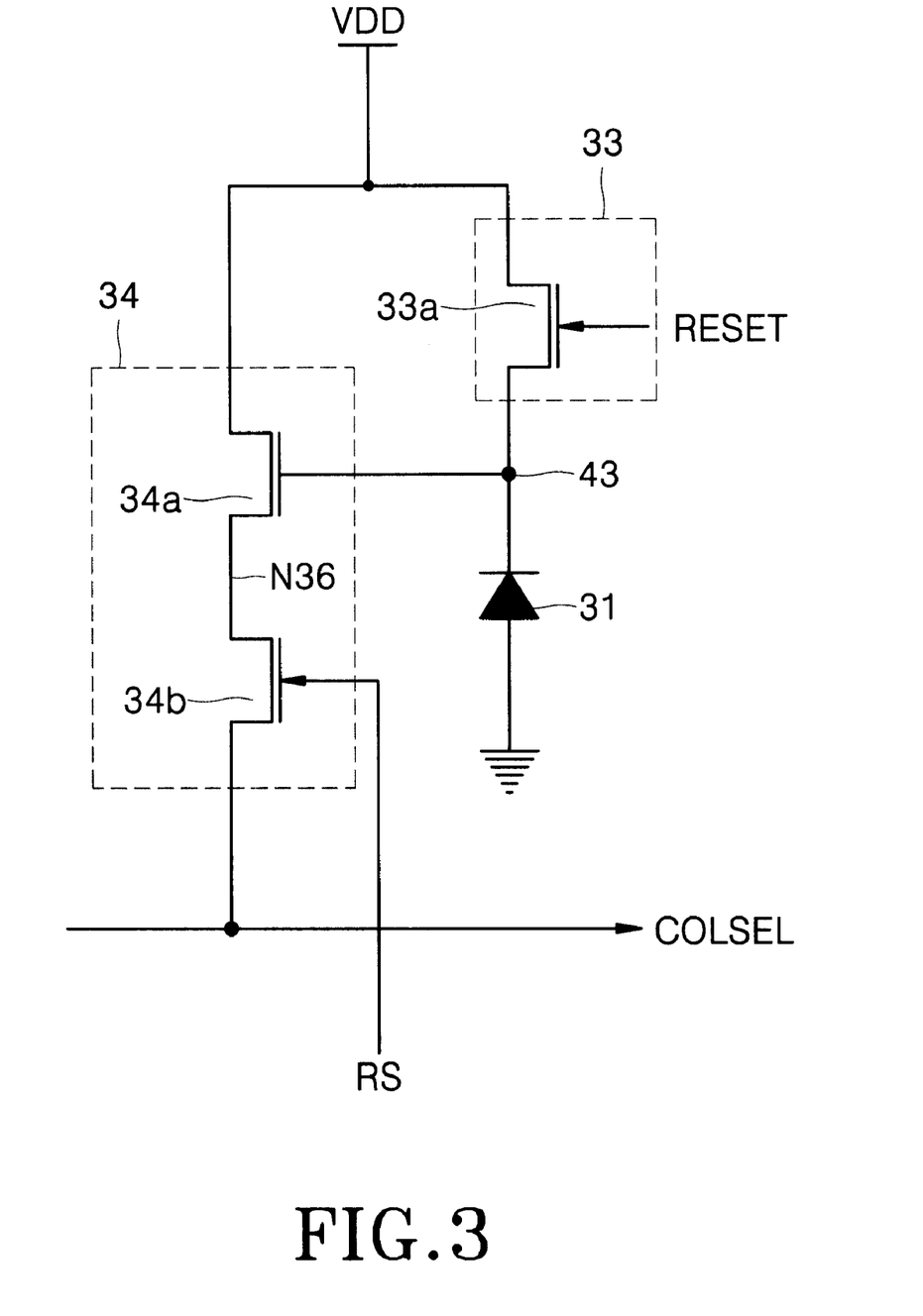
FIG. 3 is a circuit diagram conceptually showing an operation of a CMOS active pixel according to a first, a second and a third embodiment of the invention.

FIG. 3 is a circuit diagram conceptually showing an operation of a CMOS active pixel according to a first, a second and a third embodiment of the invention. The CMOS active pixel according to the preferred embodiments comprises a floating diffusion layer 43, a photo-diode 31, a reset circuit 33 and an output circuit 34. Preferably, the reset circuit 33 has a reset transistor 33a. The output circuit 34 has a selecting transistor 34a and an access transistor 34b, to realize a source follower circuit in a pixel level.

The floating diffusion layer 43 receives a signal charge generated from the photo-diode 31. That is, the photo-diode 31 generates and accumulates the signal charge depending on externally applied electromagnetic energy (for example, light etc.). Then, due to the accumulated signal charge, a voltage is produced on the floating diffusion layer 43. The floating diffusion layer 43 serves as a source node of the reset transistor 33a in the reset circuit 33.

The change in the voltage of the floating diffusion layer 43 influences the voltage at a gate node of the selecting transistor 34a, which functions as a driver of the output circuit 34. Consequently, the voltage at an access node N36 is changed. In this case, the access node N36 functions as a source node of the selecting transistor 34a or a drain node of the access transistor 34b.

As described above, the voltages on floating diffusion layer 43 and the source node N36 of the selecting transistor 34a change by accumulating signal charge. A row selecting signal RS, which selects a row of a pixel array (not shown), is supplied to a gate of the access transistor 34b. A row of the pixel array is selected by the row selecting signal RS. In this case, the voltage caused by the accumulation of charge in the selected pixel is transferred to a column selecting line.

In the embodiments, the reset circuit 33 is controlled by a reset signal RESET. That is, when the reset signal goes to logic HIGH, the reset transistor 33a is turned on. Then, the signal charge accumulated in the photo-diode is reset and the floating diffusion layer 43 is reset to a VDD-Vt level (hereinafter, referred to as a reset voltage level). VDD and Vt represent an external power voltage and a threshold voltage of the reset transistor 33a, respectively.

In the pixel selected with the row selecting signal RS, the voltage of the access node N36 is transferred to the column selecting line COLSEL.

FIRST EMBODIMENT

Figure 4:
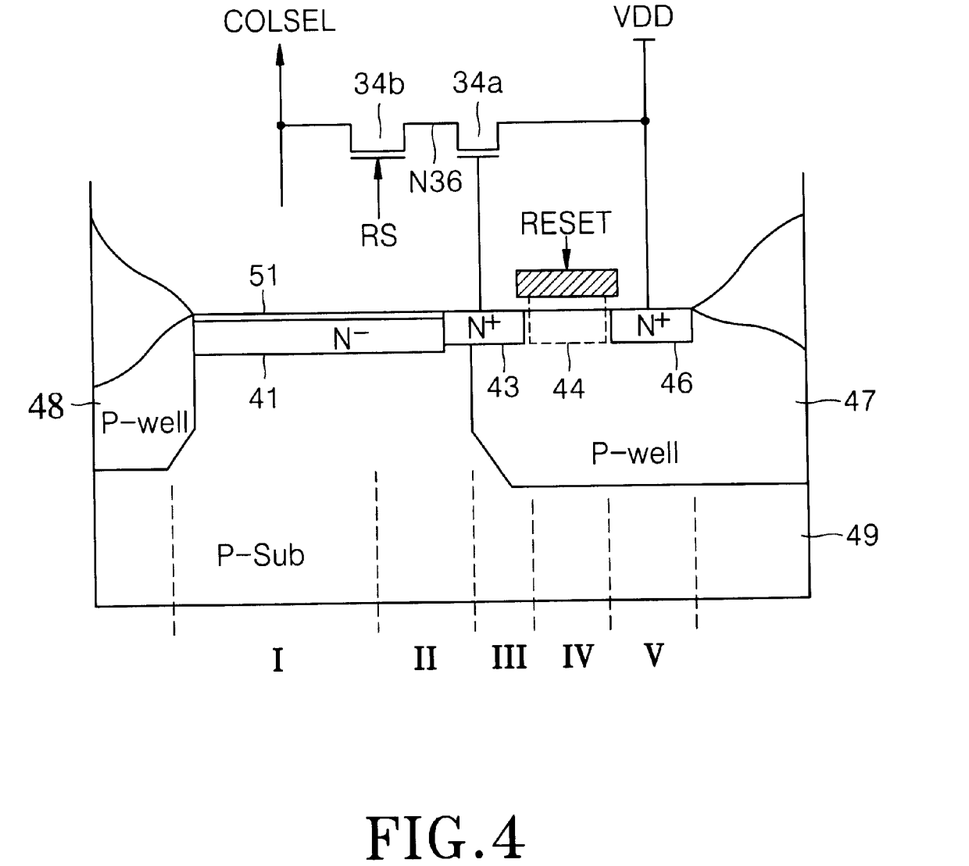
FIG. 4 depicts a cross section of a photo-diode of the CMOS active pixel according to the first embodiment, with related circuitry.

FIG. 4 depicts a cross section of a photo-diode of a CMOS active pixel according to the first embodiment, with related circuitry. Referring to FIG. 4, the photo-diode of the CMOS active pixel includes an upper diode dopant layer 51 doped with a $P^+$-type dopant and a lower diode dopant layer 41 doped with an $N^-$-type dopant. The lower diode dopant layer 41 is formed to contact a lower portion of the upper diode dopant layer 51. The upper diode dopant layer 51 and the lower diode dopant layer 41 are formed also to contact the floating diffusion layer 43. In this case, a PN junction area of the photo-diode can be increased due to the $P^+$-type upper diode dopant layer 51 formed between the lower diode dopant layer 41 and a substrate surface.

In this specification, "N-type" means that majority carriers are electrons rather than holes. "P-type" means that majority carriers are holes rather than electrons. Also, it is understood that the doping concentration of a dopant layer designated in the specification and drawings with a "P" or "N" and adding the superscript "$-$", is less than that of the dopant layer where the superscript "$+$" is added.

Preferably, a portion of the floating diffusion layer 43 is included in a P-well 47 formed on a P-type semiconductor substrate 49. The upper diode dopant layer 51 is electrically connected with the semiconductor substrate 49 through a P-well 48. Therefore, the lower diode dopant layer 41 is fully depleted and, the electron potential energy of the lower diode dopant layer is higher than that of the floating diffusion layer 43 in an initial state.

FIG. 4, an area I and an area II represent the lower diode dopant layer 41. The area I and the area II, corresponding to the lower diode dopant layer 41, are classified for easily comparing the first embodiment with a second and a third embodiment to be described later. An area III, an area IV and an area V correspond to the floating diffusion layer 43, a channel layer 44 of the reset transistor and a drain layer 46 of the reset transistor, respectively.

Figure 5A:
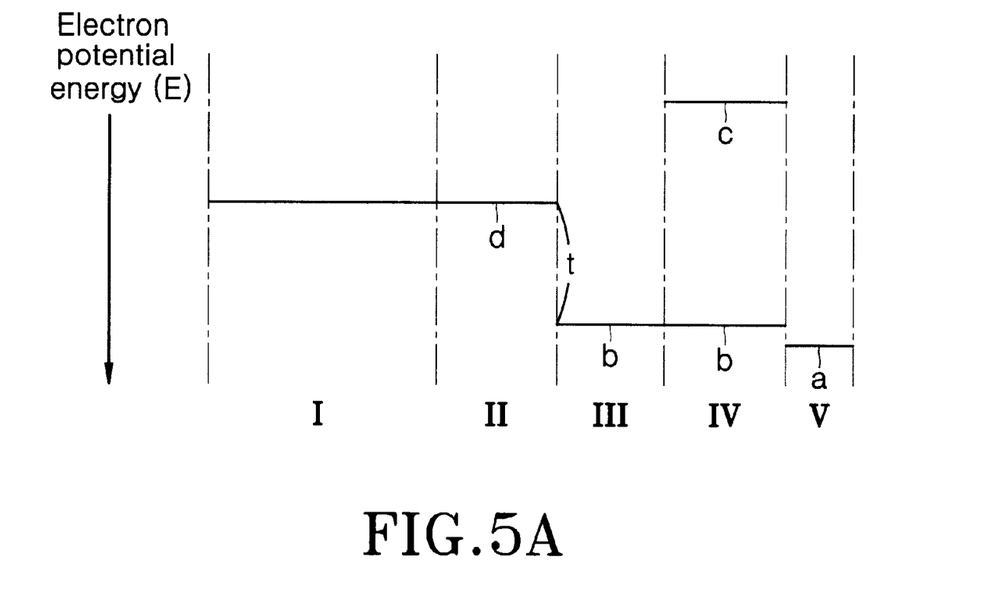
FIGS. 5A through 5D are representations of processes of accumulating and transferring a signal charge in the photo-diode of the CMOS active pixel according to the first embodiment.

FIGS. 5A through 5D illustrate states in the processes of accumulating and transferring the signal charge in the photo-diode of the CMOS active pixel according to the first embodiment FIG. 5A represents an initial state prior to accumulating the signal charge. In FIG. 5A, a solid line "a" represents an initial electric potential energy level of the drain layer 46 of the reset transistor 33a, which is supplied with an external power voltage VDD. A solid line "b" represents an initial electric potential energy level of the floating diffusion layer 43, which is doped to be of the $N^+$-type. An initial electric potential energy level of the lower diode dopant layer 41, which is doped to be $N^+$-type, is represented as a solid line "d" higher than the solid line "b". That is, there is an electric potential energy difference "t" between the floating diffusion layer 43 and the lower diode dopant layer 41. The electric potential energy difference functions as a barrier between the lower diode dopant layer 41 and the floating diffusion layer 43. Therefore, the lower diode dopant layer 41 is separated from the floating diffusion layer 43.

Meanwhile, a solid line "c" represents an initial electric potential energy level of the channel layer 44 of the reset transistor 33a in a turned-off state. However, when the reset transistor 33a is turned-on, the initial electric potential energy level of the channel layer 44 falls to the solid line "b".

Figure 5B:
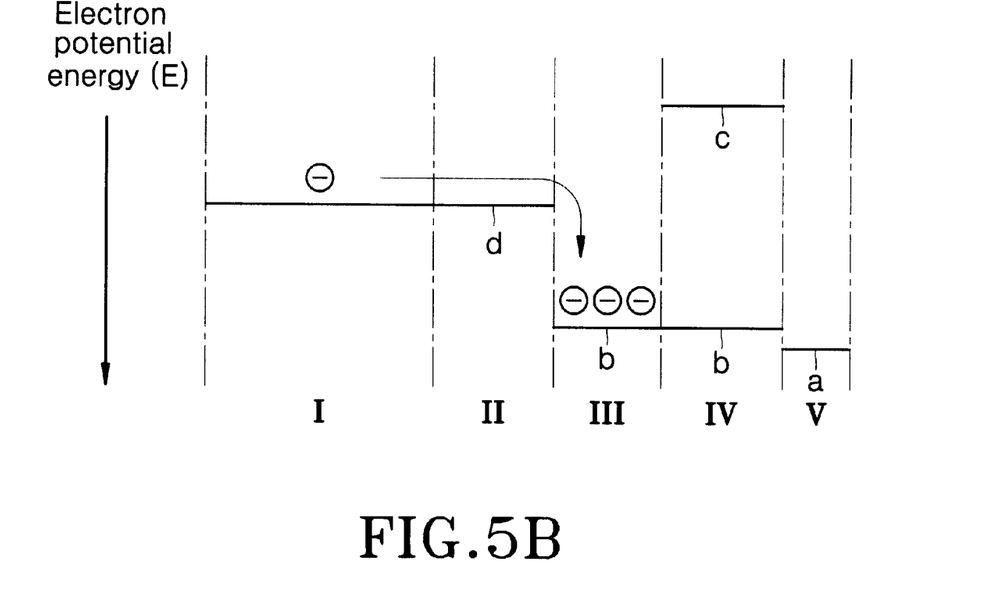

Thereafter, as shown in FIG. 5B, the signal charge generated from the lower diode dopant layer 41 is accumulated in the floating diffusion layer 43. That is, most of capacitance is materialized in the area III corresponding to the floating diffusion layer 43. Therefore, as shown in a region "A1" of FIG. 10, the slope of a voltage Vout to illumination graph line is very sharp.

Figure 5C:
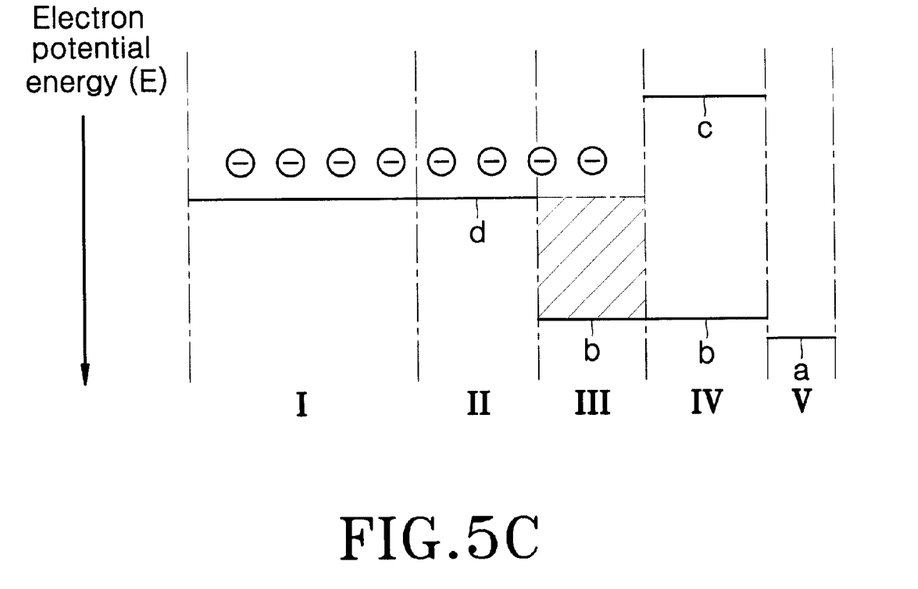

Also, due to the signal charge to be successively generated, the electric potential energy level of the floating diffusion layer 43 rises to the solid line "d". Then, as shown in FIG. 5C, the generated signal charge accumulates in the areas I, II and III. That is, all of the areas I, II and III can be materialized as capacitors. Therefore, as shown in FIG. 10, in a region "A2" of higher illumination, the slope of the voltage Vout to illumination graph line for the first embodiment is relatively gentle, compared with the sharper slope in the region "A1" of lower illumination.

Figure 5D:
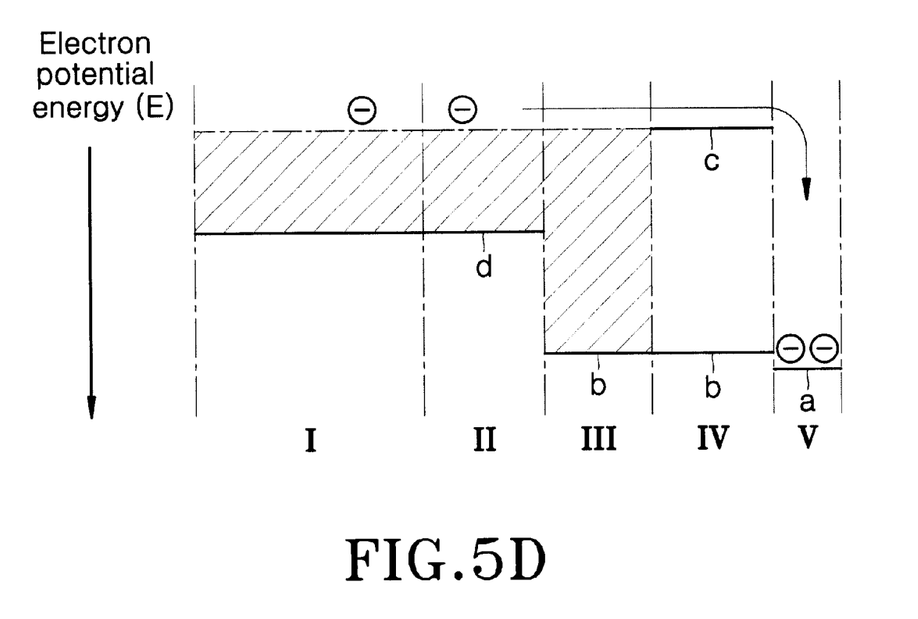

Further, due to the signal charge to be further successively generated, the electric potential energy levels of the areas I, II and III rise to the solid line "c". Then, as shown in FIG. 5D, the generated signal charge is moved to the drain layer 46 of the reset transistor, i.e., the area V, through the channel layer 44 of the reset transistor, i.e., the area IV. In this case, since the drain layer 46 is in contact with a terminal of the power voltage VDD, the moved signal charge is drained to the terminal of the power voltage VDD. Therefore, as shown in FIG. 10, in a region "A3" of highest illumination, even if the illumination is increased, the voltage Vout is maintained at a constant level Vconst.

Figure 10:
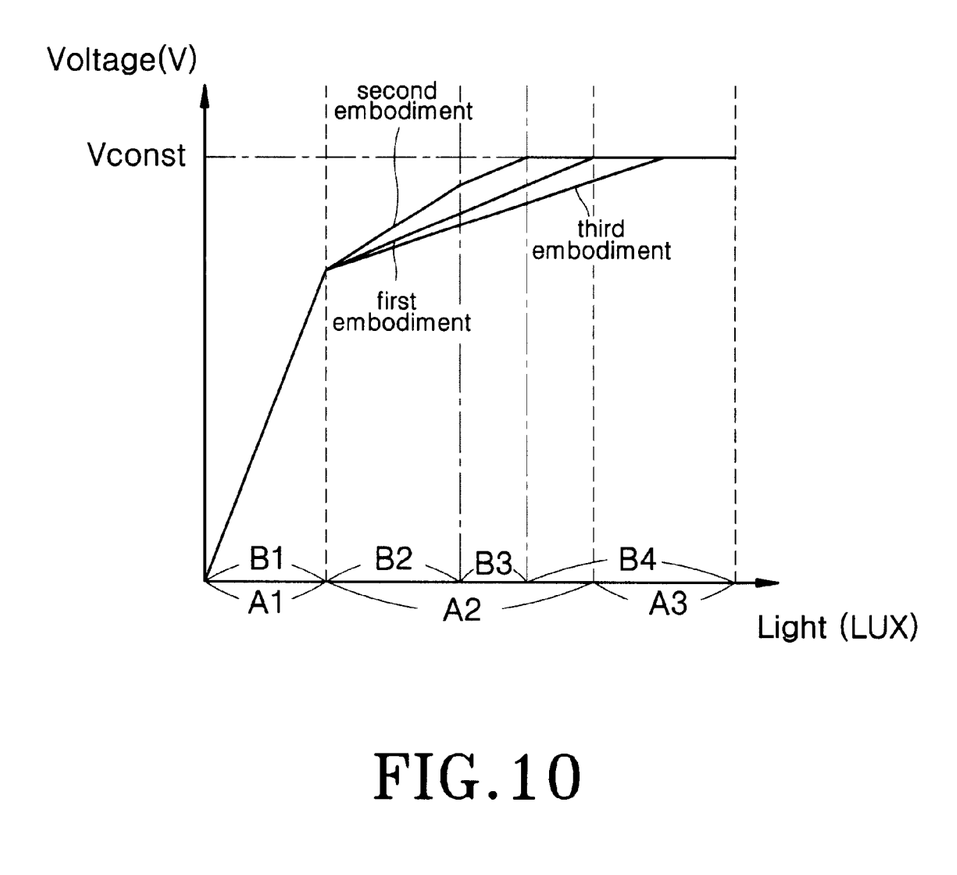
FIG. 10 depicts a voltage change in a floating diffusion layer depending on illumination of the CMOS active pixel according to the first through third embodiments.

Consequently, as shown in FIG. 10, the slope of the first embodiment graph line of the voltage of the floating diffusion layer 43 verses the illumination becomes successively more gentle as the illumination level increases.

Therefore, as compared with the conventional CMOS active pixel, the CMOS active pixel according to the first embodiment of the invention has high sensitivity with a minimal reduction of a receiving light area. Also, the CMOS active pixel according to the first embodiment has an advantage that sensitivity is desirably changed depending on the illumination. That is, while the sensitivity of the diffusion layer is high when the layer is subjected to a low illumination, the sensitivity changes as the illumination rises from low to high. Therefore, an operating range of the image sensor using the CMOS active pixel of the invention can be expanded.

SECOND EMBODIMENT

Figure 6:
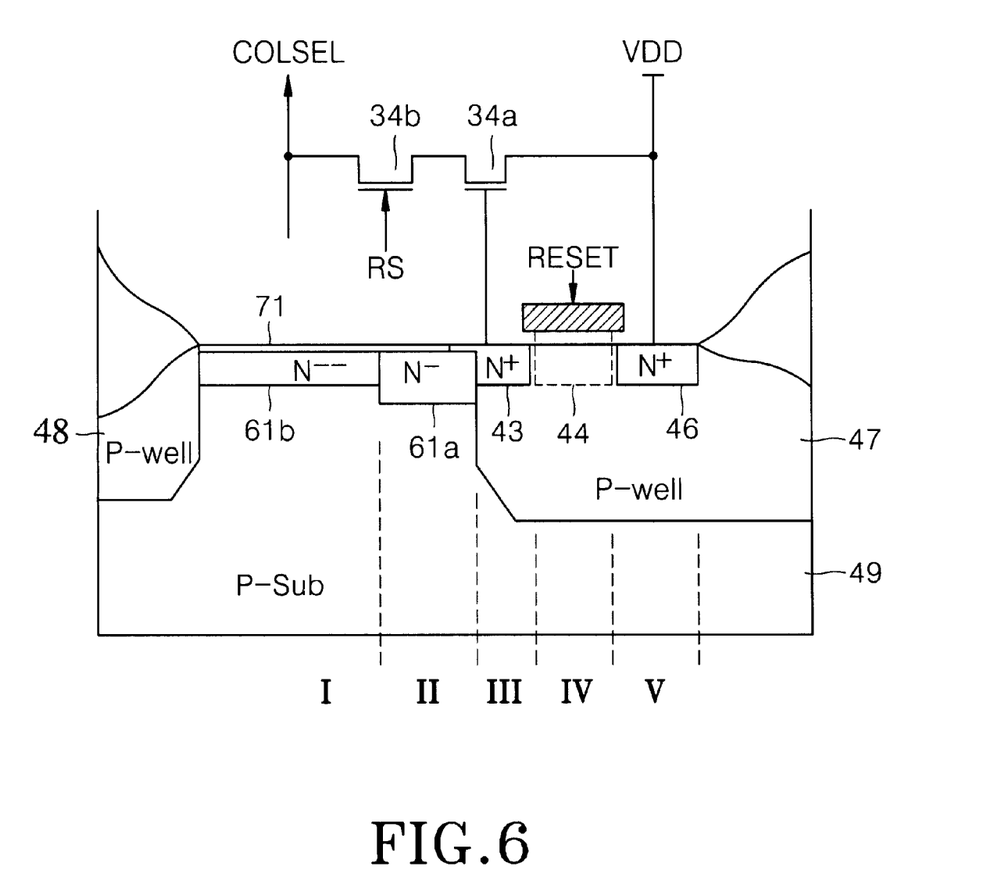
FIG. 6 illustrates a cross section of a photo-diode of the CMOS active pixel according to the second embodiment, with related circuitry.

FIG. 6 illustrates a cross section of a photo-diode of a CMOS active pixel according to the second embodiment, with related circuitry. The second embodiment shown in FIG. 6 is similar to the first embodiment shown in FIG. 4, except in the structure of the lower diode dopant layer forming the photo-diode.

In the first embodiment, the lower diode dopant layer 41 is an $N^-$-type dopant layer. However, in the second embodiment, a first lower diode dopant layer 61a is formed as an $N^-$-type dopant layer and a second lower diode dopant layer 61b is formed as an $N^{--}$-type dopant layer. The first and the second lower diode dopant layers 61a and 61b are formed to contact a lower portion of an upper diode dopant layer 71. Also, the first lower diode dopant layer 61a is formed to contact the floating diffusion layer 43, and the second lower diode dopant layer 61b is formed to contact the first lower diode dopant layer 61a.

The upper diode dopant layer 71 is electrically connected with the semiconductor substrate 49 through a P-well 48. Therefore, the first lower diode dopant layer 61a and the second lower diode dopant layer 61b are fully depleted, and the electron potential energy of the first lower diode dopant layer 61a is higher than that of the floating diffusion layer 43 in an initial state. Also, the electron potential energy of the second lower diode dopant layer 61b is higher than that of the first lower diode dopant layer 61a in the initial state.

Figure 7A:
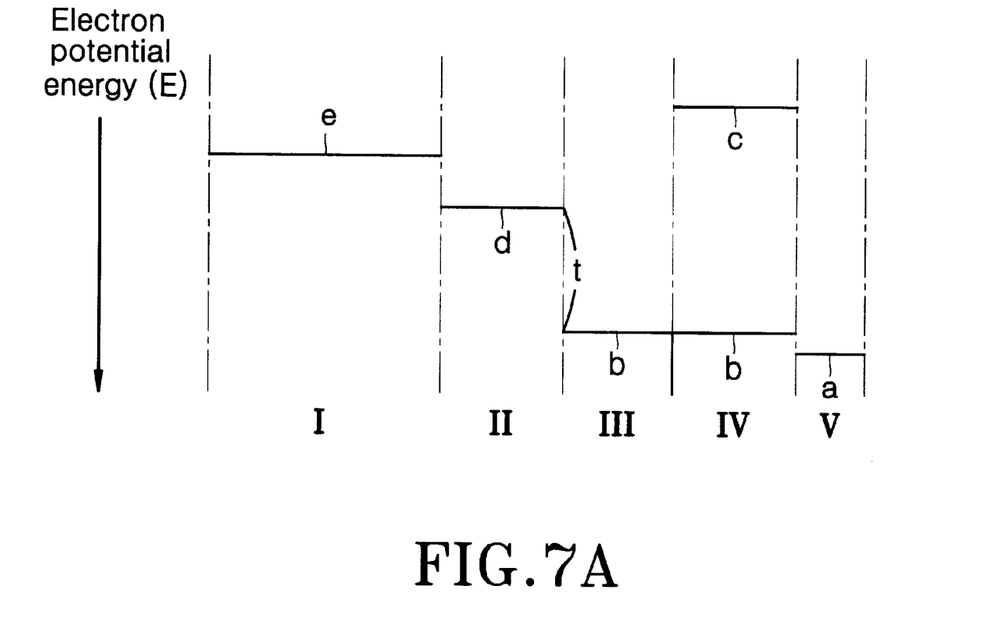
FIGS. 7A through 7E depict processes of accumulating and transferring a signal charge in the photo-diode of the CMOS active pixel according to the second embodiment.

FIG. 7A represents an initial state of the pixel prior to its accumulating a signal charge. Solid lines "a" through "d" shown in FIG. 7A correspond to the solid lines "a" through "d" described in the first embodiment. However, in FIG. 7A, a solid line "e" represents an electric potential energy level of the area I. In this case, since the area II corresponds to the $N^-$-type dopant layer and the area I corresponds to the $N^{--}$-type dopant layer, the electric potential energy level represented by the solid line "e" is higher than that represented by the solid line "d".

Figure 7B:
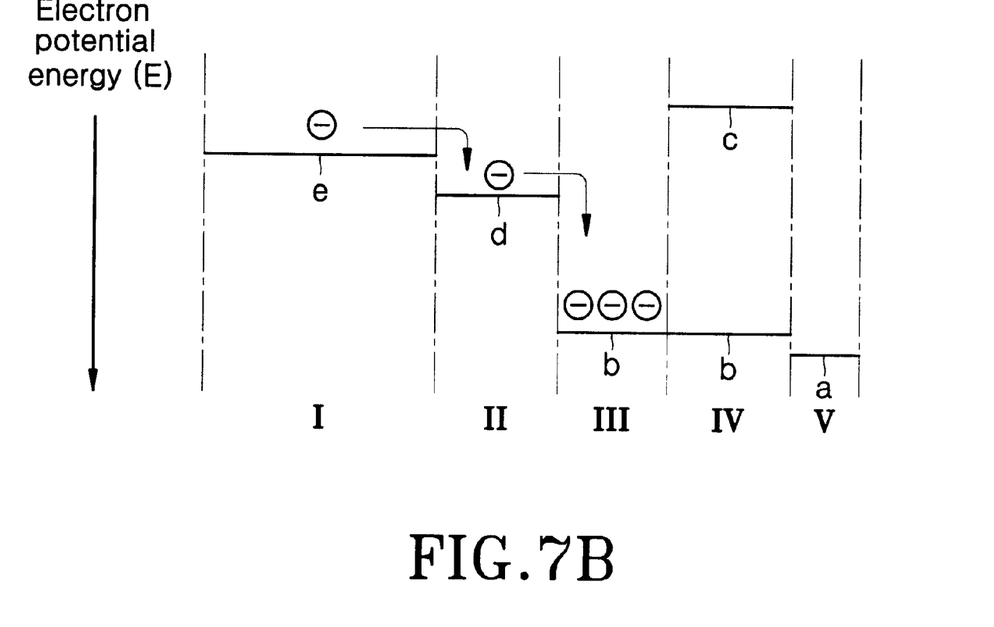

Thereafter, as shown in FIG. 7B, the signal charge generated from the second lower diode dopant layer 61b, i.e., from the area I is accumulated in the floating diffusion layer 43 through the first lower diode dopant layer 61a, i.e., through the area II. In this case, as shown in FIG. 10, in a region "B1", the slope of the first embodiment graph line, representing the rate of increase of the voltage Vout with increases in the illumination in a low illumination state, is very sharp. The corresponding slope in the second embodiment is nearly equal to that in the first embodiment.

Figure 7C:
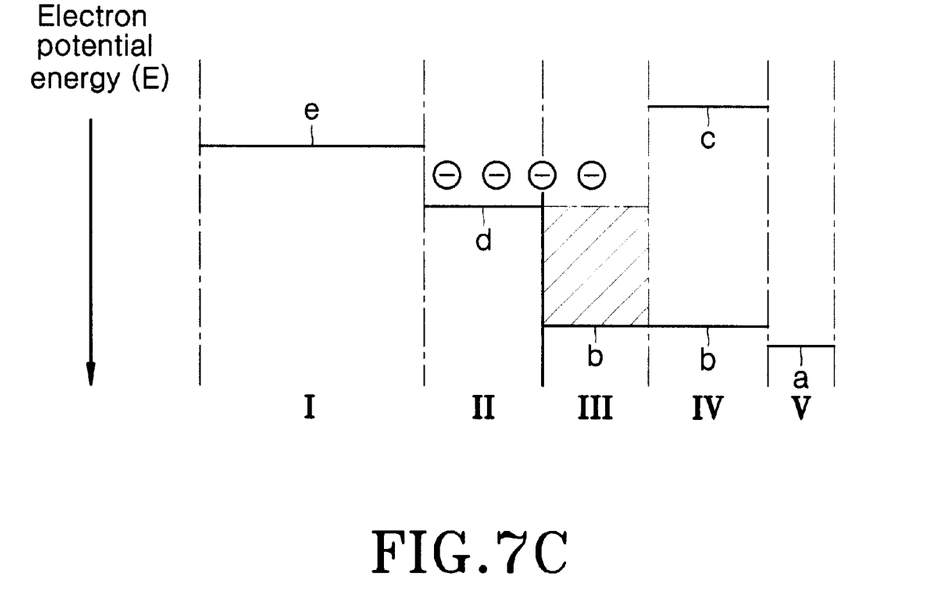

Due to the signal charge to be successively generated, the electric potential energy level of the floating diffusion layer 43 rises to the level represented by the solid line "d". Then, as shown in FIG. 7C, the generated signal charge is accumulated in the areas II and III. Therefore, as shown in FIG. 10, in a region "B2", the slope of the voltage Vout verses illumination graph line is relatively gentle, as compared with that in the region "B1". However, the slope in the region "B2" is relatively sharp, compared with that in the first embodiment.

Figure 7D:
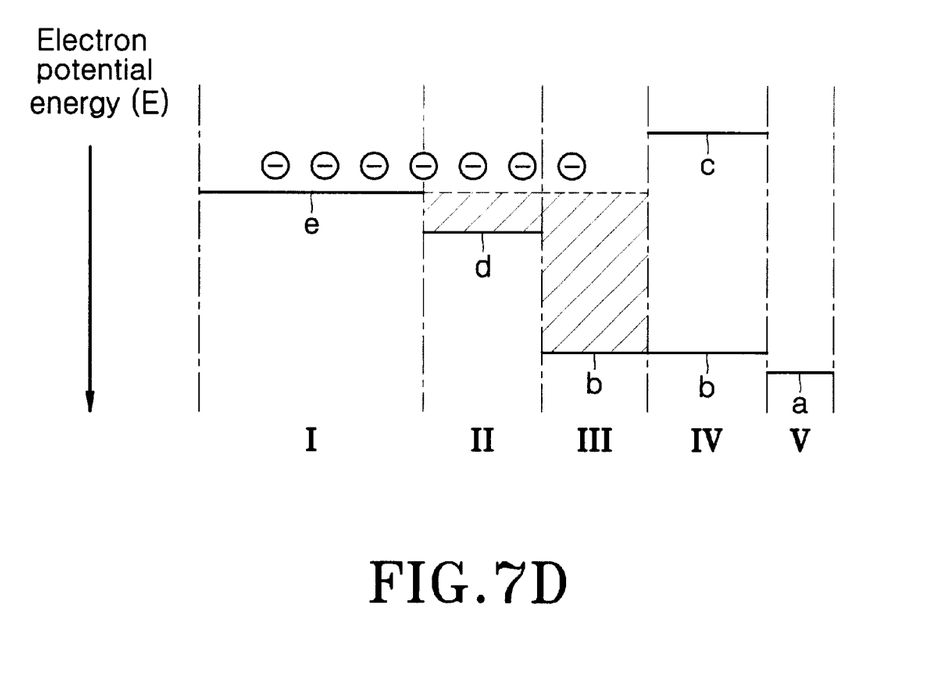

Also, due to the signal charge to be further successively generated, the electric potential energy levels of the first lower diode dopant layer 61a and the floating diffusion layer 43 rise to the level represented by the solid line "e". Then, as shown in FIG. 7D, the generated signal charge is accumulated in the areas I, II and III. Therefore, as shown in FIG. 10, for a region "B3" the slope of the voltage Vout verses the illumination graph line is gentler than that shown for the region "B2".

Figure 7E:
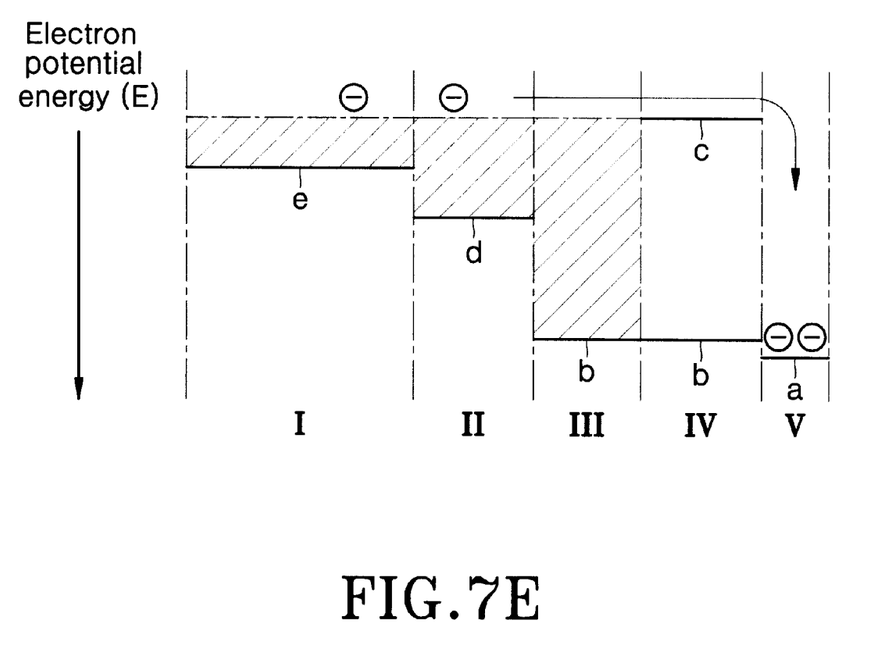

Further, due to the signal charge still to be successively generated, the electric potential energy levels of the areas I, II and III rise to that represented by the solid line "c". Then, as shown in FIG. 7E, the generated signal charge moves to the drain layer 46 of the reset transistor, i.e., the area V, through the channel layer 44 of the reset transistor, i.e., the area IV. In this case, since the drain layer 46 is in contact with a terminal of the power voltage VDD, the signal charge that has moved to the drain layer 4b drains to the terminal of the power voltage VDD. Therefore, as shown in a region "B4" of FIG. 10, at this stage even with further increases in the illumination, the voltage Vout is maintained at a constant level Vconst.

Consequently, the CMOS active pixel according to the second embodiment has such a characteristic that the slope of the second embodiment graph line in FIG. 10, representing the rate of increase of the voltage of the floating diffusion layer 43 with increases in the illumination, becomes successively more gentle as the illumination increases.

THIRD EMBODIMENT

Figure 8:
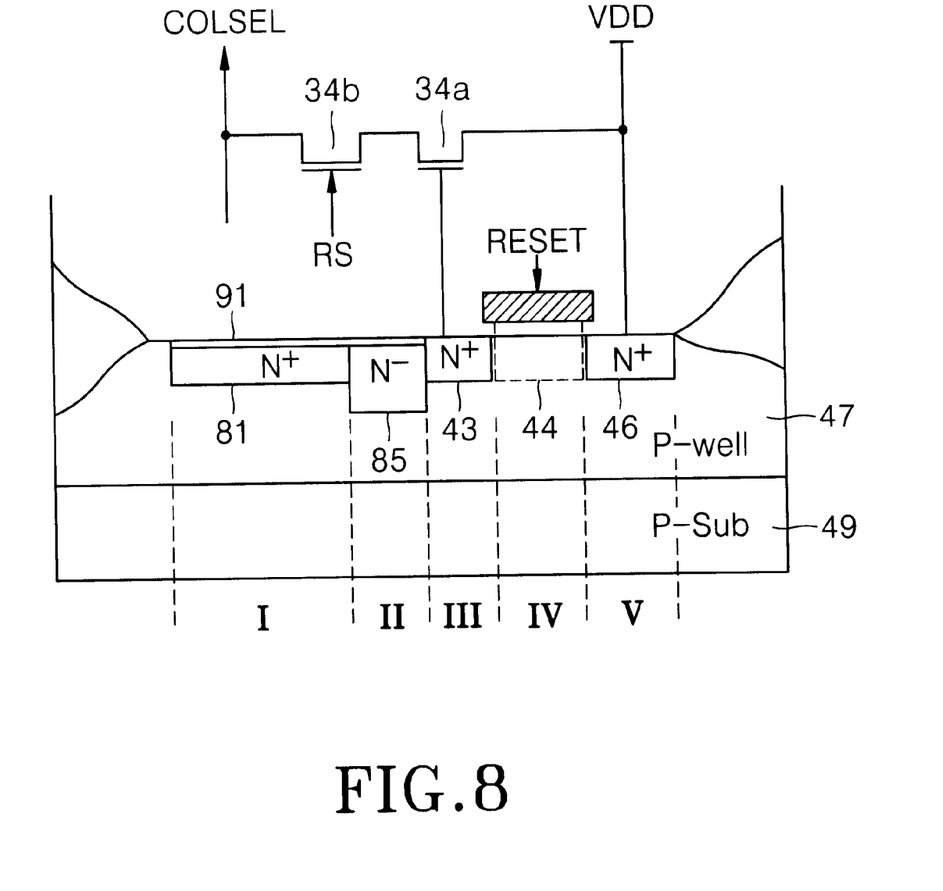
FIG. 8 shows a cross section of a photo-diode of a CMOS active pixel according to the third embodiment, with related circuitry.

FIG. 8 shows a cross section of a photo-diode of a CMOS active pixel according to a third embodiment, with related circuitry. The third embodiment shown in FIG. 8 is similar to the first embodiment shown in FIG. 4, except for the structure of the lower diode dopant layer forming the photo-diode.

Referring to FIG. 8, in the CMOS active pixel according to the third embodiment, an $N^+$-type lower diode dopant layer 81 forming a side junction of the photo-diode is separated from an $N^+$-type floating diffusion layer 43 by an $N^-$-type separating layer 85. In this embodiment, both the lower diode dopant layer 81 and the floating diffusion layer 43 are of the $N^+$-type. However, it is easily understood by those skilled in the art that the dopant concentration in the lower diode dopant layer 81 can be different from that in the floating diffusion layer 43. The lower diode dopant layer 81, the floating diffusion layer 43 and the separating layer 85 are formed in a P-well 47 provided for this purpose. In FIG. 8, an area I, an area II, an area III, an area IV and an area V represent the lower diode dopant layer 81, the separating layer 85, the floating diffusion layer 43, a channel layer 44 of a reset transistor and a drain layer 46 of the reset transistor, respectively.

Figure 9:
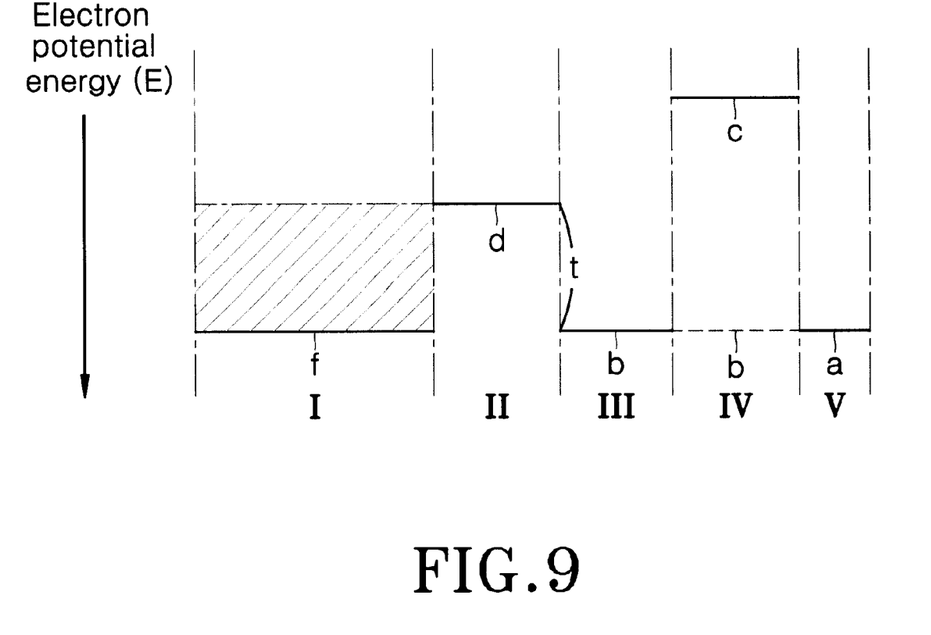
FIG. 9 is a representation of an initial electric potential energy in each area of the CMOS active pixel according to the third embodiment.

FIG. 9 illustrates an initial electric potential energy in each area of the CMOS active pixel according to the third embodiment. Referring to FIG. 9, an initial state of the CMOS active pixel according to the third embodiment is similar to that of the CMOS active pixel according to the first embodiment shown in FIG. 5A. In this case, since the lower diode dopant layer 81, i.e., the area I is an $N^+$-type dopant layer, the electric potential energy level of the area I is low and is represented by a solid line "f". However, even though the generation of the signal charge has not started, the electric potential energy level of the lower diode dopant layer 81 rises to a level represented by the solid line "d" due to another factor, such as an alpha (a) particle, generally.

The lower diode dopant layer in the third embodiment is $N^+$-type, while the lower diode dopant layer in the first embodiment is $N^-$-type. Therefore, the capacitance in the case of the third embodiment is greater than that in the case of the first embodiment, referring to the areas I and II. Thus, as the electric potential energy level of the area I of FIG. 9 reaches above that represented by the solid line "f", the slope of the third embodiment graph line in FIG. 10, which represents the rate of increase of the floating diffusion layer voltage with increases in the illumination, becomes gentle. The successive processes of accumulating and transferring the signal charge in the photo-diode of the third embodiment are similar to those of the first embodiment. Therefore, the successive processes of accumulating and transferring the signal charge can be easily understood by reference to FIG. 10. Accordingly, the successive processes are not described herein for the third embodiment.

As described above, according to the CMOS active pixel of the invention, the light sensitivity can be effectively increased with minimum reduction of light receiving area. Further, since noise in an image sensor using the CMOS active pixel according to this invention is reduced, the quality of the image captured by the image sensor is improved.

While this invention has been particularly shown and described with reference to the preferred embodiments thereof, it will be understood by those skilled in the art that various changes and equivalents may be made without departing from the spirit and scope of the invention. For example, in the above-described embodiments, the photo-diode has one or two lower diode dopant layer(s). However, other embodiments are possible, in which the photo-diode has three or more lower diode dopant layers, with each layer having a respective doping concentration different from the others. Therefore, the scope of the invention should be determined with reference only to the appended claims.

What is claimed is:

1. A CMOS active pixel formed on a semiconductor substrate, comprising:

a floating diffusion layer of a first dopant type, the floating diffusion layer receiving a signal charge;

a photo-diode for generating the signal charge and transferring the signal charge to the floating diffusion layer, the photo-diode having a first lower diode dopant layer and a second lower diode dopant layer, each of the first dopant type, and an upper diode dopant layer of a second dopant type, the polarity of the second dopant type being opposite to that of the first dopant type, the upper diode dopant layer being formed on both the first and the second lower diode dopant layer, the first lower diode dopant layer being formed between the floating diffusion layer and the second lower dopant layer;

a reset means controlling a voltage level of the floating diffusion layer to a reset voltage level in response to a control signal; and an output means generating an output signal corresponding to the voltage level of the floating diffusion layer, wherein the polarity of the semiconductor substrate is that of the second dopant type, wherein the upper diode dopant layer is electrically connected with the semiconductor substrate, wherein an electric potential energy of the first lower diode dopant layer is higher than that of the floating diffusion layer in an initial state of the photo-diode, and wherein the second lower diode dopant layer has a higher electric potential than does the first lower diode dopant layer in the initial state of the photo-diode.

2. The CMOS active pixel in accordance with claim 1, wherein the first lower diode dopant layer has a lower concentration of dopant than does the floating diffusion layer, and the second lower diode dopant layer has a lower concentration of dopant than does the first lower diode dopant layer.

3. The CMOS active pixel in accordance with claim 2, wherein the first dopant type is N-type and the second dopant type is P-type.

4. The CMOS active pixel in accordance with claim 2, wherein a portion of the floating diffusion layer is formed in a well of the second dopant type.

5. The CMOS active pixel in accordance with claim 4, the upper diode dopant layer has a greater concentration of dopant than does the well.

6. A CMOS active pixel formed on a semiconductor substrate, comprising:

a floating diffusion layer of a first dopant type, the floating diffusion layer receiving a signal charge;

a photo-diode for generating the signal charge and transferring the signal charge to the floating diffusion layer, the photo-diode including:
   a lower diode dopant layer of the first dopant type,
   a separating layer, the separating layer being formed between the lower diode dopant layer and the floating diffusion layer, and
   an upper diode dopant layer of a second dopant type, the polarity of the second dopant type being opposite to that of the first dopant layer, the upper diode dopant layer being formed on the lower diode dopant layer and the separating layer;
a reset means controlling a voltage level of the floating diffusion layer to a reset voltage level in response to a control signal; and an output means generating an output signal corresponding to the voltage level of the floating diffusion layer, wherein the polarity of the semiconductor substrate is that of the second dopant type, wherein the upper diode dopant layer is electrically connected with the semiconductor substrate, and wherein the separating layer has a higher electric potential than does the floating diffusion layer in an initial state of the photo-diode.

7. The CMOS active pixel in accordance with claim 6, wherein the first dopant type is N-type and the second dopant type is P-type.

* * * * *